(12) United States Patent
Hussa

(10) Patent No.: US 7,233,057 B2
(45) Date of Patent: Jun. 19, 2007

(54) INTEGRATED CIRCUIT PACKAGE WITH OPTIMIZED MOLD SHAPE

(75) Inventor: Esa Hussa, Lempäälä (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/856,705

(22) Filed: May 28, 2004

(65) Prior Publication Data

US 2005/0263886 A1    Dec. 1, 2005

(51) Int. Cl.
*H01L 23/04* (2006.01)
(52) U.S. Cl. .................. 257/678; 257/738; 257/787
(58) Field of Classification Search ........ 257/787–795, 257/738, 678, 689, 701
See application file for complete search history.

(56) References Cited

U.S. PATENT DOCUMENTS

| | | | |
|---|---|---|---|
| 5,490,324 A | 2/1996 | Newman | 29/830 |
| 5,905,633 A | 5/1999 | Shim et al. | 361/704 |
| 5,953,589 A | 9/1999 | Shim et al. | 438/106 |
| 6,124,637 A | 9/2000 | Freyman et al. | 257/736 |
| 6,258,626 B1 * | 7/2001 | Wang et al. | 438/107 |
| 6,291,892 B1 | 9/2001 | Yamaguchi | 257/778 |
| 6,779,783 B2 * | 8/2004 | Kung et al. | 257/780 |
| 2002/0182841 A1 | 12/2002 | DiStefano et al. | 438/611 |
| 2003/0034568 A1 | 2/2003 | Chai et al. | 257/788 |

* cited by examiner

*Primary Examiner*—Douglas W. Owens
(74) *Attorney, Agent, or Firm*—Ware, Fressola, Van Der Sluys & Adolphson, LLP

(57) ABSTRACT

The invention relates to an integrated circuit package, in particular an integrated chip size package or an integrated chip scale package, comprising a substrate carrying a die, and connection elements, interconnection elements, connecting pins of said die with said connection elements, and a mold encapsulating said die on said substrate. To increase reliability and to reduce failure due to deformation stress, the invention provides said mold with reduced stiffness at areas located substantially at one of said interconnection elements providing increased flexibility of said package at said areas compared to other areas of said package.

13 Claims, 5 Drawing Sheets

INTEGRATED CIRCUIT PACKAGE WITH OPTIMIZED MOLD SHAPE

FIELD OF THE INVENTION

The invention relates to an integrated circuit package, in particular ball grid array package or a land grid array package, comprising a substrate carrying a die and connection elements, interconnection elements connecting pins of said die with said connection elements, and a mold encapsulating said die in said substrate.

The invention also relates to a method for manufacturing such an integrated circuit package, wherein a substrate is provided, a die is placed on said substrate, connection elements are placed on said substrate, interconnection elements connecting pins of said die with said connection elements are provided, and a mold encapsulating said die on said substrate is provided.

Eventually, the invention relates to the use of such an integrated circuit package.

BACKGROUND

Electronic components are subject to miniaturizing. Therefore, electronic components of these products need to be ever smaller and lighter. As a result, more and more integrated and high integrated circuits may be required.

Reducing the sizes of the masks and increasing the number of connection pins generated the need of new designs, such as pin grid arrays (PGA), ball grid arrays (BGA) and land grid arrays (LGA). The particulars of these designs are that they provide their connection pins throughout the whole array surface, rather than just on its periphery, as was the case with former designs.

In particular ball grid arrays and LGAs are subject to significant failures in electronic components. These failures which may be a consequence of a shock impacted from drop and fatigue from thermal and bending cycling also apply to any other type of packages, interconnections and connection types, such as soldering and gluing. The packages fail mainly due to failure in the interconnection between the component and the printed wiring board, in particular in the solder joints or in the printed wiring board (PWB) build-up.

The problems of failure due to shock impact increase even more in case of stacking of several dies on top of each other, and encapsulating these within one mold as the mold becomes thicker. However, stacking is one of the major trends in future electronic components.

The package design has a significant effect on the reliability of the integrated circuit, in particular in mobile device environments, where the devices are subject to dropping, bending and thermal cycling loads.

SUMMARY OF THE INVENTION

The invention overcomes these problems by providing an integrated circuit package wherein said mold is provided with reduced stiffness at areas located substantially at one of said interconnection elements providing increased flexibility of said package at said areas compared to other areas of said package.

In case a consumer electronic device, or a mobile communication equipment is dropped, or subject to any other shock, the printed wiring board (PWB) bends. The integrated circuit component (IC) tries to follow the deformation of the PWB. Typically, the package of the IC is much stiffer than the PWB. This causes high stress to the connection and interconnection elements, especially in the corner and edge areas of a package, which causes them to fail first. By providing areas within said mold with reduced stiffness, the stress on the connection and interconnection elements may be reduced, and the component reliability may be improved. This is also the case in other conditions, such as bending and thermal cycling.

The interconnection elements may be wires for wire bonding or any other elements, such as elements for flip chip technology.

In particular for ball grid arrays (BGA) or micro ball grid array (µBGA) chips, the increased flexibility of the package increases their reliability.

For ball grid array packages the chip or die is placed on a substrate, such as, for example, an elastomer, a fiber reinforced polymer laminate, or a polyimidfilm. On the lower side of the substrate solder balls may be located, which may be connected to the die by electrically conducting elements, such as, for example, via connections, bonding wires, or any other connection means.

For these packages, the reduced stiffness at the areas where interconnection elements are located may improve reliability, insofar as the interconnection elements may only be subject to reduced mechanical stress due to bending. For example, the connections between the PWB and the solder balls suffer only reduced mechanical stress due to the increased flexibility.

Tape based packages may, for example, also be used for providing circuit packages. These packages require no via connections, and may be applied directly onto the surface of the PWB.

The inventive integrated circuit package has an optimized mold compound shape. The package is designed so that it is more flexible and thus the load on the critical interconnections may be reduced. This is done by minimizing the stiffening effect of the mold compound at these areas.

Embodiments provide the mold with reduced thickness at said areas to provide said reduced stiffness. Reducing the thickness of the mold at the areas where the connections and interconnections are located, reduces the stiffness of the packages at these locations. As a result, the mechanical bending stress onto the interconnections may be reduced. This may increase reliability of the package.

Embodiments also provide that said mold at said areas is comprised of mold material, solder mask material or other flexible material. Flexibility of said package by reducing the stiffness may also be achieved by using more flexible material at the respective locations.

In particular reducing the stiffness of the mold at the edges of said package is provided according to embodiments. Minimizing the amount of mold compound at the edges and/or corner areas of the package reduces its stiffening effect.

Forming said mold quadratic, rectangular, circular, or cross shaped, or any other N-edge shape is further provided according to further embodiments. The shape of the mold may be characterized by the areas where the mold is thicker. The areas where the mold is thinner, and insofar the stiffness reduced, are the counterparts of the described formations.

To improve the reliability, in particular to avoid cracks within the package, embodiments provided forming said areas within said mold by providing round-shaped step deformations. According to these embodiments, the change of mold thickness is accounted for by providing round shaped edges. The surface of the mold thus has no steep edges. The reduced thickness at the edges in addition may provide increased flexibility.

To reduce package size, further embodiments provide locating said connection elements on said substrate on a side opposite to said die. These embodiments also may provide using solder balls as connection elements. Any other connections, such as screwing, gluing may also be possible. The package may for example be a BGA or LGA. Any other packages and interconnection types may as well be possible.

For providing dense packaging and small component sizes, certain embodiments provide connecting said connection elements to said connecting pins through said substrate using via connections. Also, tape substrates, such as for example polyimide substrates, where the solder joints may be connected to the connection pins directly through holes in the substrate, without the need of vias, may also be possible according to embodiments.

To increase density and to provide more functionality within one component, embodiments provide stacking at least two of said dies, providing a stacked component. Stacking said dies results in placing at least two dies above each other. Furthermore, these dies may be encapsulated by only one mold. In such a case, more than one die may be connected to a ball grid array located on an opposite side of said substrate. This may increase packages density. However, even though the mold is thicker, the whole package may be more flexible than a conventional package with only one die. As the areas of interconnection elements are reduced in stiffness, the risk of cracks due to mechanical stress may be reduced.

According to embodiments, applying inventive components on top of a package of a package stack may also be possible. In this case, the increased flexibility may only be applied to the topmost component, however, the connection elements of this component are subject to reduced mechanical stress.

A further embodiment provides a flip chip design of said packages, where the flip chip connections are used inside the package instead of wire bonding. Flip chip technology may provide dense packaging of the components.

According to certain embodiments, an integrated circuit package wherein exactly one substrate is provided carrying at least one die, and wherein said at least one die is encapsulated onto said substrate by exactly one mold, is provided. This may result in packages where only one substrate is used, and several dies may be encapsulated within the one mold onto said single substrate providing increased package density. It may also be possible to provided multiple substrates and substrate layers, each of which may be comprised with a at least one single molded die.

Another aspect of the invention is a method for manufacturing an integrated circuit package, wherein a substrate is provided, a die is placed on said substrate, connection elements are placed on said substrate, interconnection elements connecting pins of said die with said connection elements are provided, and a mold encapsulating said die on said substrate is provided, characterized in that said mold is formed such that areas of said mold substantially located at one of said interconnection elements have reduced stiffness providing increased flexibility of said package at said areas compared to other areas of said package.

A further aspect of the invention is the use of such an integrated circuit package, in consumer electronic devices and/or in mobile communication devices.

The invention will be described in more detail with reference to the following figures.

BRIEF DESCRIPTION OF THE DRAWINGS

In the figures show.

DETAILED DESCRIPTION

Figure 1:
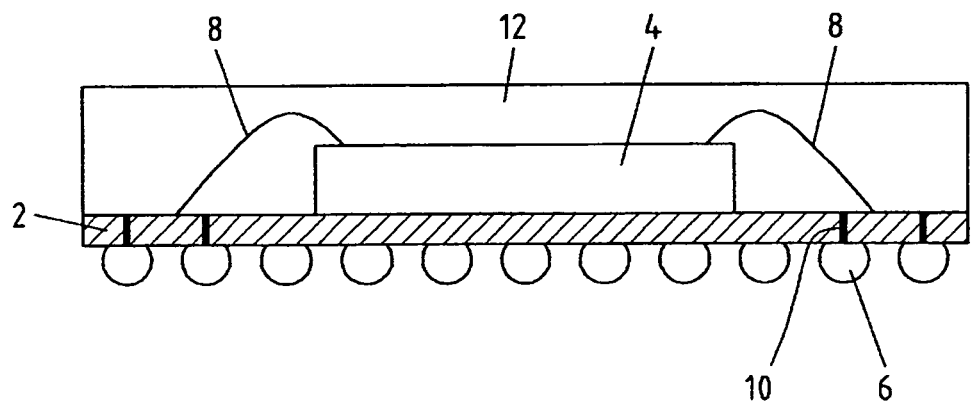
FIG. 1 a prior art integrated circuit package.

Reference Numbers 2 substrate
4 die
6 solder balls
8 bonding wire
10 vias
12 mold
14 area of reduce stiffness
16 printing wiring board
20 provide substrate
22 provide die
24 provide ball grid array and flexible bond ribbons and interconnect die with ball grid array
26 encapsulate package by molding
28 form encapsulation FIG. 1 depicts an integrated circuit package comprised of a substrate 2, a die 4, solder balls 6, bonding wires 8, via connections 10, and a mold 12.

The die 4 comprises the integrated circuit. The die is encapsulated onto said substrate 2 by said mold 12. Connection pins of said die 4 are connected to via connections 10 by bonding wires 8. The via connections 10 connect the bonding wires 8 with the solder balls 6. The depicted integrated circuit package is unnecessarily rigid in terms of stiffness, which will increase mechanical stress on the interconnections when mechanical stress is applied to the PWB, and thus reduces the reliability of the package.

Figure 4:
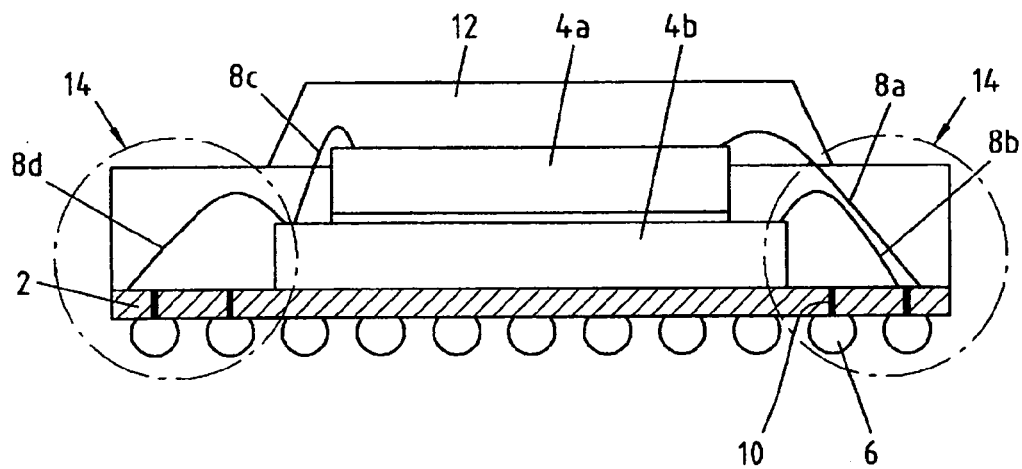
FIG. 4 a further integrated circuit package according to the invention.
Figure 5:
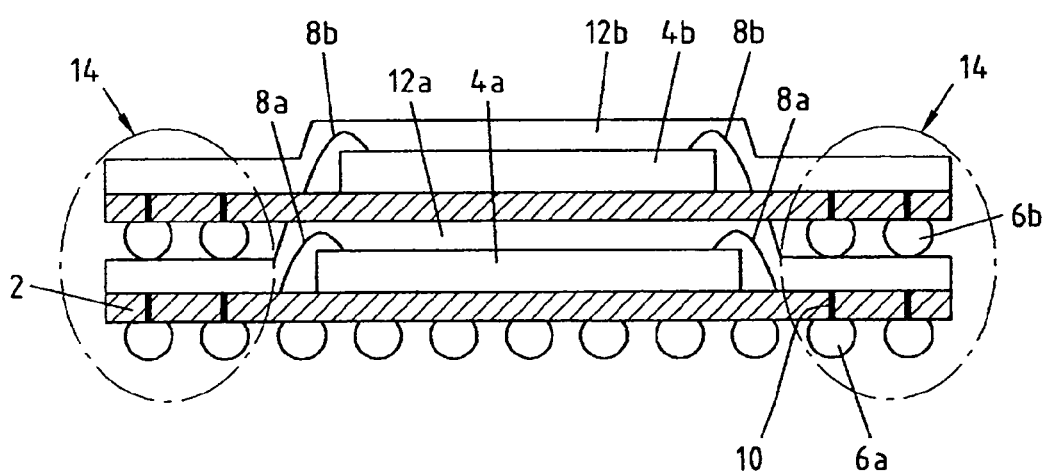
FIG. 5 an integrated circuit package stack according to the invention.

Stacking of the components as shown in FIG. 5 and stacking of dies as shown in FIG. 4 increases the problem, as the package become even stiffer. Stacking of components will increase the stiffness of lower packages significantly. Here, the invention my be applied to the upper package only, thus reducing not only the stiffness of the upper package, but also of the whole package stack which will improve reliability of the whole package.

When the PWB, which is connected to the solder balls 6, is bent, the package tries to follow the PWB deformation. As the package is stiff in comparison to the PWB, it causes high loading stress onto the interconnections, such as the via connections 10 and the solder balls 6. In case of bending, dropping or other mechanical stress, such as thermal cycling, the interconnecting via connections 10 and solder balls 6 break up, and the package is destroyed. The failure may occur also in PWB side. The invention will reduce the loading there as well, thus the reliability is improved.

Figure 2:
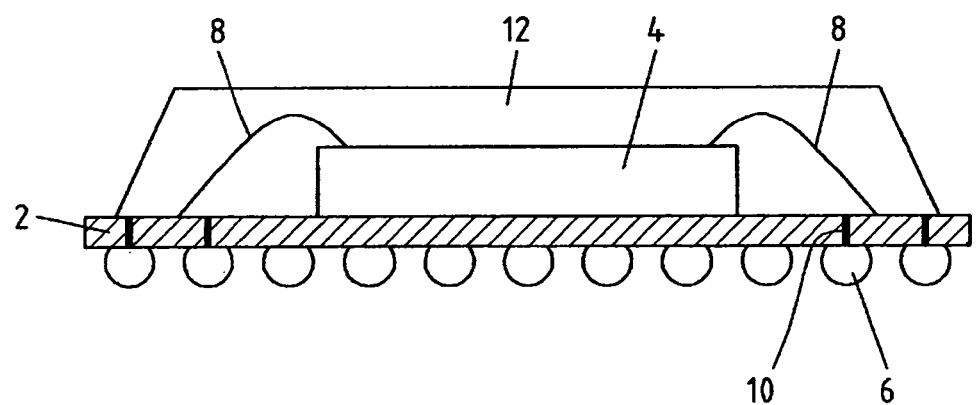
FIG. 2 a further prior art integrated circuit package.

Depicted in FIG. 2 is a package where the mold is chamfered at its edges. The mold may not necessarily reach the substrate edges. However, the depicted solution does not reduce the stiffness of the package to such an extent that its reliability is increased.

Figure 3:
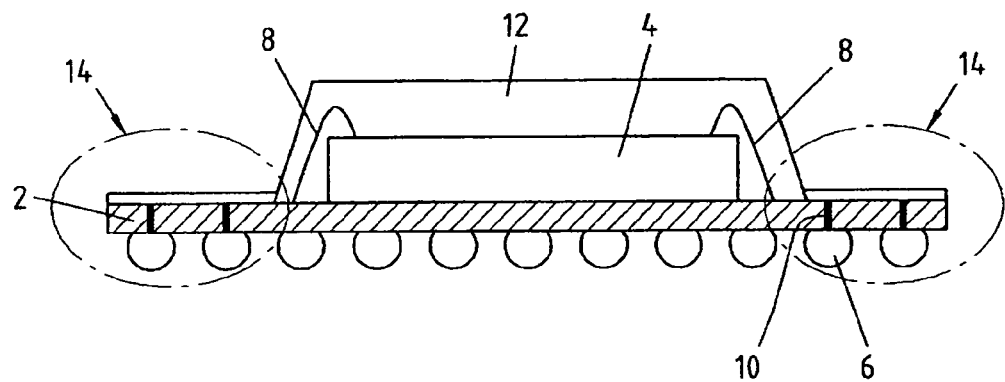
FIG. 3 an integrated circuit package according to the invention.

FIG. 3 depicts an integrated circuit package according to the invention. As in FIGS. 1 and 2, like reference numbers refer to like elements. As can be seen from FIG. 3, the mold 12 is formed such that areas of reduced stiffness 14 are created, whereby the areas of reduced stiffness 14 have a decreased thickness of the mold 12 compound. The areas of reduced stiffness 14 are located at positions where the solder balls 6 tend to have the highest loading. Thus, when the PWB is deformed, the package may follow the deformation without causing cracks within the interconnections, as at these areas, the package has reduced stiffness and may follow the deformation of the PWB. The essential characteristic of these embodiments is that the area of reduced stiffness covers the area of the most critical interconnections, typically connections in package corner and/or edge area.

At areas of reduced stiffness 14, a mold compound or any other material, such as solder mask material may be located, which is capable of reducing the stiffness compared to other areas of the package.

FIG. 4 depicts a package where two dies 4a, 4b are located on one single substrate 2 and encapsulated within one single mold 12. The mold 12 is formed such that areas of reduced stiffness 14 are located at the outer sides of the package. Reducing the mold 12 in thickness increases flexibility of the whole package and thus increases its reliability.

FIG. 5 shows a package stack. The package stack may be comprised of two dies 4a, 4b, each of which is encapsulated within a mold 12a, 12b. The edges of each of said molds 12a, 12b are reduced in stiffness. The areas of reduced stiffness 14 may lie above each other. The reduced stiffness of mold 12b may be achieved by the reduced thickness of mold 12b at its edges. This reduces stiffness of the whole package stack. Connections between the upper and lower package may be achieved by solder balls 6b.

Figure 6A:
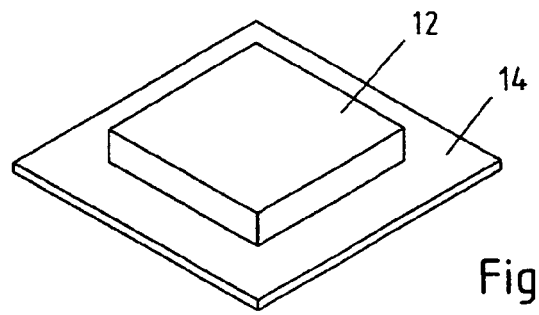
FIGS. 6a-6d show different shapes of integrated circuit packages.

FIG. 6a depicts a rectangular shape of a mold 12. Along the outer edges of the mold 12, areas of reduced stiffness 14, having a reduced thickness of the mold compound, are located. The edges between the mold with increased thickness and the mold with reduced thickness may be formed such that they are round shaped. Steep edges may thus be avoided, avoiding predetermined break points.

Figure 6B:
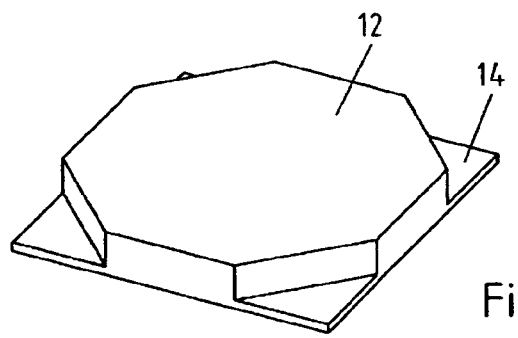

FIG. 6b depicts an octagonal shape of an inventive integrated circuit package. The mold 12 is formed such that along its edges areas of reduced stiffness 14 are located.

Figure 6C:
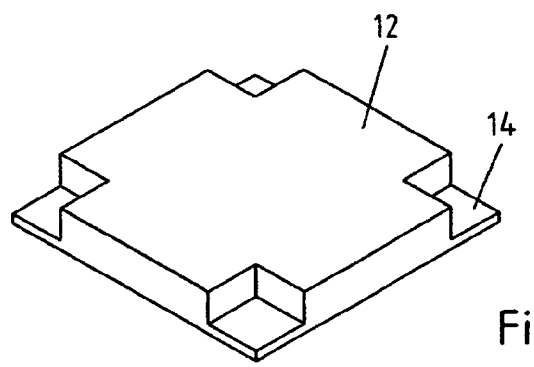

FIG. 6c depicts a cross shaped integrated circuit package. The mold 12 is formed such that at its edges areas of reduced stiffness 14 are located.

Figure 6D:
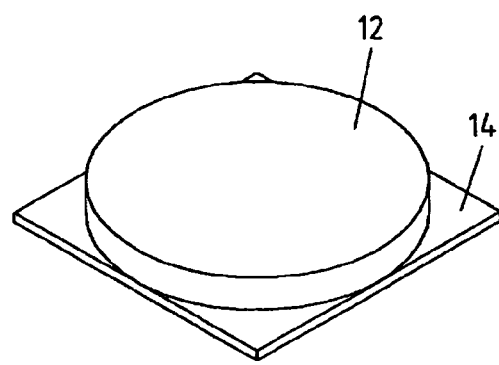

FIG. 6d depicts a circular shape of an integrated circuit package. The mold 12 is formed such that areas of increased thickness form a circular shape and areas of reduced stiffness 14 are located at the edges of the packages. Any other shapes may as well be possible.

Figure 7:
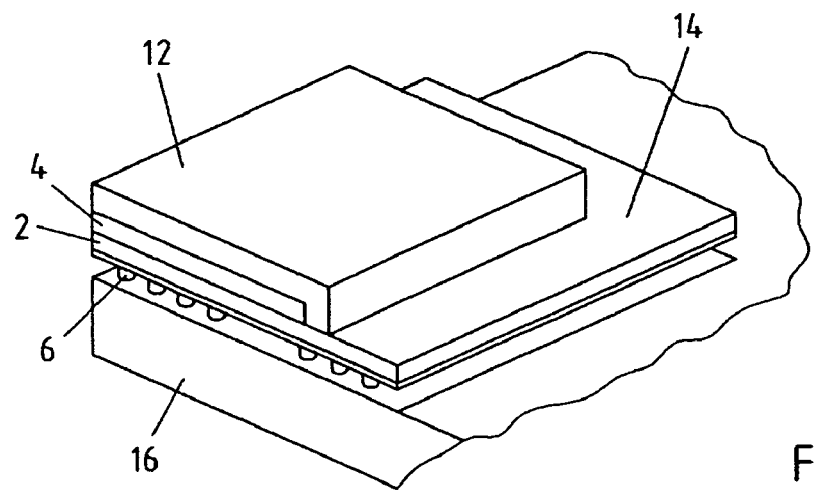
FIG. 7 a sectional view of an integrated circuit package according to the invention.

FIG. 7 depicts a cross sectional view onto an integrated circuit package according to the invention. On a printed wiring board 16, carrying a plurality of components, the inventive integrated circuit package is located. Through solder balls 6, the integrated circuit package is bonded to the printed wiring board 16. The integrated circuit package is located on said substrate 2, carrying a die 4. The die 4 is encapsulated by mold 12. The encapsulation of die 4 by mold 12 is designed such that mold 12 is reduced in thickness along its outer edges. By that, areas of reduced stiffness 14 are formed.

Along the areas of reduced stiffness 14, the flexible bond wires 8 and via connections 10 interconnecting the die 4 with the solder balls 6 are located. In case the printed wiring board 16 is bent, the integrated circuit package may follow this deformation and cracks within the interconnections may be avoided. Cracks in other locations may also be avoided be increasing flexibility within these regions.

Figure 8:
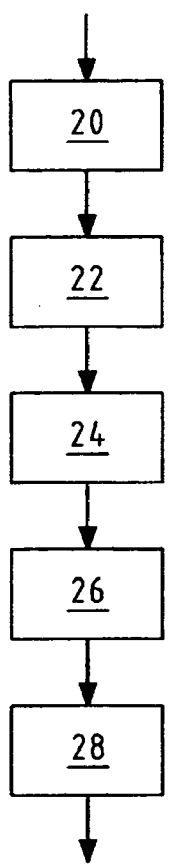
FIG. 8 a method according to the invention.

FIG. 8 depicts a method according to the invention.

In a first step a substrate is provided (20). Onto said substrate a die is formed (22). A ball grid array is placed on said substrate and connected to said die by bonding wires (24). After that, the integrated circuit package is encapsulated by molding (26). During molding, the molding compound is shaped such that areas are provided, where the stiffness of the mold is reduced, in particular by reducing the thickness of the mold (28). The areas of reduced stiffness are located at positions, where the most critical solder joints are located. Thus, reliability of the integrated circuit package is increased and cracks due to deformation stress may be avoided.

What is claimed is:

1. Integrated circuit package, in particular a ball grid array and a land grid array comprising:

a substrate carrying a die and connection elements, interconnection elements connecting pins of said die with said connection elements, and a mold encapsulating said die on said substrate, wherein said mold has reduced thickness at areas of via connections to provide reduced stiffness, wherein said mold with reduced thickness covers the whole area located at said via connections providing increased flexibility of said package at said areas compared to other areas of said package; and wherein said areas within said mold are formed by providing round shaped step deformations.

2. Integrated circuit package of claim 1, wherein said mold at said areas is comprised of mold material, solder mask material or other flexible material.

3. Integrated circuit package of claim 1, wherein said mold is reduced in stiffness at the edges of said package.

4. Integrated circuit package of claim 1, wherein said mold is formed quadratic, rectangular, circular, or cross shaped.

5. Integrated circuit package of claim 1, wherein said connection elements are located on said substrate on a side opposite to said die.

6. Integrated circuit package of claim 1, wherein said connection elements are solder balls.

7. Integrated circuit package of claim 5, wherein said connection elements are connected to said connecting pins through said substrate by via connections.

8. Integrated circuit package of claim 1, wherein at least two dies are stacked to provide at least one of a) a stacked component, or b) a package stack wherein packages are stacked.

9. Integrated circuit package of claim 1, wherein said interconnection elements have a flip chip design.

10. Integrated circuit package of claim 1, wherein exactly one substrate is provided carrying at least two dies and wherein said at least two dies are encapsulated onto said substrate by exactly one mold.

11. Method for manufacturing an integrated circuit package, in particular of claim 1, wherein a substrate is provided, a die is placed on said substrate, connection elements are placed on said substrate, interconnection elements connecting pins of said die with said connection elements are provided, and a mold encapsulating said die on said substrate is provided, wherein said mold has reduced thickness at areas of via connections to provide reduced stiffness, said mold with reduced thickness covers the whole area at said via connection providing increased flexibility of said package at said area compared to other areas of said package.

12. Use of an integrated circuit package of claim 1, in consumer electronic devices and/or in mobile communication devices.

13. Integrated circuit package, in particular a ball grid array and a land grid array comprising:

a substrate carrying a die and connection elements, interconnection elements connecting pins of said die with said connection elements, and a mold encapsulating said die on said substrate, wherein said mold is provided with reduced stiffness at areas located substantially at areas of via connections providing increased flexibility of said package at said areas compared to other areas of said package, and wherein said areas within said mold are formed by providing round shaped step deformations.

* * * * *